United States Patent [19]

Fox et al.

[11] 4,412,327

[45] Oct. 25, 1983

[54] TEST CIRCUIT FOR CHECKING MEMORY OUTPUT STATE CONTINUOUSLY DURING TIME WINDOW

[75] Inventors: William B. Fox, Columbus; Harry L. Maddox, Reynoldsburg, both of Ohio

[73] Assignee: Western Electric Company, Inc., New York, N.Y.

[21] Appl. No.: 237,836

[22] Filed: Feb. 25, 1981

[51] Int. Cl.³ .......................................... G01R 31/28
[52] U.S. Cl. .................................. 371/21; 324/73 R; 371/25
[58] Field of Search ........................... 371/21, 25, 27; 324/73 R, 73 AT, 73 PC

[56] References Cited

U.S. PATENT DOCUMENTS

| | | | |
|---|---|---|---|
| 3,657,527 | 4/1972 | Kassabgi et al. | 371/25 |
| 4,049,956 | 9/1977 | Van Veen | 371/21 |
| 4,109,236 | 8/1978 | Besenfelder et al. | 371/6 |
| 4,122,995 | 10/1978 | Franke | 371/25 |
| 4,139,147 | 2/1979 | Franke | 371/25 |
| 4,271,515 | 8/1981 | Axtell et al. | 324/73 R |
| 4,335,457 | 8/1982 | Early | 324/73 R |

*Primary Examiner*—Charles E. Atkinson
*Attorney, Agent, or Firm*—K. R. Bergum

[57] ABSTRACT

A test circuit (15 or 65), comprised of a plurality of parallel-connected circuit modules ($15_{o\text{-}n}$ or $65_{o\text{-}n}$), in response to both control signals from an associated commercially available automated test set (12), and output data from a test set-accessed read/write memory (14) under test, continuously senses for the presence of valid "one" or "zero" outputs on the data bit lines of the memory throughout a test set-established time window test period. When the memory output from a given data bit line, as applied to only an associated one of the circuit modules, is determined, as normally expected, to be continuously valid during each successive time window test period, a "pass" RESULT signal is generated by that circuit module and continuously applied to the test circuit (12) for flagging at any time between termination of the time window and the end of a given test set-established memory read cycle. Conversely, should the output on any memory data bit line be determined to be invalid (i.e., relative to predetermined threshold voltage limits) at any time during a time window test period, the particular one of the circuit modules ($15_{o\text{-}n}$ or $65_{o\text{-}n}$) receiving that invalid data generates a "fail" RESULT signal that is likewise continuously applied to the test set (12) during the same time interval as for a "pass" RESULT signal.

21 Claims, 6 Drawing Figures

DATA......ONE OUTPUT BIT FROM MEMORY UNDER TEST.

HIGH REF...PREDETERMINED VOLTAGE ABOVE WHICH A LOGIC ONE IS CONSIDERED VALID.

LOW REF....PREDETERMINED VOLTAGE BELOW WHICH A LOGIC ZERO IS CONSIDERED VALID.

EXD........CONTROL SIGNAL FROM TEST SET THAT CONDITIONS TEST CIRCUIT AS TO WHAT OUTPUT STATE TO EXPECT FROM THE MEMORY UNDER TEST (MUT) DURING A GIVEN TIME WINDOW INTERVAL.

DVP........CONTROL SIGNAL FROM TEST SET THAT DEFINES THE TEST TIME WINDOW.

RESULT.....OUTPUT SIGNAL FROM TEST CIRCUIT — THE LOGIC STATE THAT TEST SET EXPECTS (ONE OR ZERO) FOR PASS AND THE PARTICULAR COMPLEMENT THEREOF FOR FAIL STATUS OF MUT.

FIG. 6

TEST CIRCUIT FOR CHECKING MEMORY OUTPUT STATE CONTINUOUSLY DURING TIME WINDOW

FIELD OF THE INVENTION

This invention relates to the automated testing of solid state read/write memories and, more particularly, to a test circuit responsive to control signals from an associated automated test set for not only initially sensing for the presence of the proper output state of each data bit line of a strobed memory under test, but for also determining if the output state of each line remains valid continuously during each successive test set-established time window.

BACKGROUND OF THE INVENTION

In the automated testing of solid state read/write memories, a thorough performance test thereof requires more than the conventional instantaneous "snap-shot" check for the proper state of such a memory's output, as typically determined at the leading edge of each of a succession of test set-generated strobe pulses. More specifically, there should be a comprehensive test to ascertain not only if each test set-initiated memory output state is initially valid, but remains valid, i.e., if "ones" remain above a minimum threshold voltage, and if "zeros" remain below a maximum threshold voltage, throughout each test set-established Data Valid Period (DVP), or so-called time window.

Such a comprehensive test is very important because in a typical operating system environment, successive points in time when a memory residing therein will be strobed for data may vary appreciably due to unpredictable inherent system delays, such as may be caused by component tolerance variations, or extraneous noise. As such, it becomes very important to ascertain if the output state of a given memory will remain relatively constant throughout a test set-determined time window that encompasses, and appreciably extends beyond either side of, the expected pulse width-defined strobe period of the composite system.

In connection with the "snap-shot" approach to checking for the proper memory output state (i.e., at the trailing edge of a test set-generated strobe pulse), it should be apparent, of course, that one could repeat such a "snap-shot" test while varying the strobe position. Unfortunately, this would not guarantee that each memory output signal (or data bit) remained within specified limits for the entire window interval. Moreover, such variable strobe-position testing would disadvantageously appreciably lengthen the test time.

Inasmuch as present automated test sets are not adapted to provide the thorough testing of a memory's output state in the manner described above, and of concern herein, an auxiliary test circuit has been urgently needed to carry out such a testing operation on an output data bit-per line basis. In this regard, it is also very important that any auxiliary test circuit be of a type that is readily controlled by an associated test set, and can test the output state of each line of a memory at the normal operating speed thereof, and provide pass/fail output result signals that are compatible with the associated test sets built-in detection circuitry. In addition, it is very desirous that such pass/fail outputs remain available for examination by the test set at any time between the end of each time window test interval and the start of the next test cycle.

SUMMARY OF THE INVENTION

It, therefore, is an object of the present invention to provide a test circuit responsive to control signals from an associated automated test set, capable of not only initially sensing for the presence of the proper output state of each data bit line of a read/write strobed memory under test, but to also determine if the output state of each line remains valid, i.e., relative to prescribed threshold voltage limits, continuously during each test set-established Data Valid Period (DVP) or time window.

In accordance with the principles of the present invention, the above and other objects are realized in one preferred modular test circuit embodiment, adapted for use with a commercially available automated test set, wherein for each data bit line of a memory to be tested, an associated test circuit module is employed. Each module comprises a pair of AND gates, the outputs of which are coupled to the enable inputs of different ones of a pair of High and Low reference level operational amplifiers. The outputs of the amplifiers are respectively coupled to the Clear and Preset inputs of a clock-driven resettable flip-flop. The particular one of the operational amplifiers that may be conditionally enabled, to change the output of the flip-flop from a "pass" to a "fail" state, depends on whether a given output data bit signal applied thereto, from the memory being tested, corresponds in logic state with a test set-generated Expected Data (EXD) signal, applied directly to the gate associated with the High reference operational amplifier, and in inverted form, to the gate associated with the Low reference operational amplifier. A Data Valid Period (DVP) signal, that defines the time window test period, is also applied as an input to each of the AND gates. It is thus seen that the Expected Data (EXD) signal (or its complement) is used to selectively enable one of the AND gates, and indirectly and conditionally an associated operational amplifier, during a given time window to either Set (or Clear) the flip-flop should the applied data from the memory violate a predetermined threshold control voltage applied to the particular enabled operational amplifier.

As previously noted, inasmuch as each test circuit module is associated with a given memory output data bit line, the number of parallel arranged circuit modules employed in a given testing application will correspond with the number of output data bit lines of the particular memory to be tested.

DETAILED DESCRIPTION OF THE INVENTION

Figure 1:
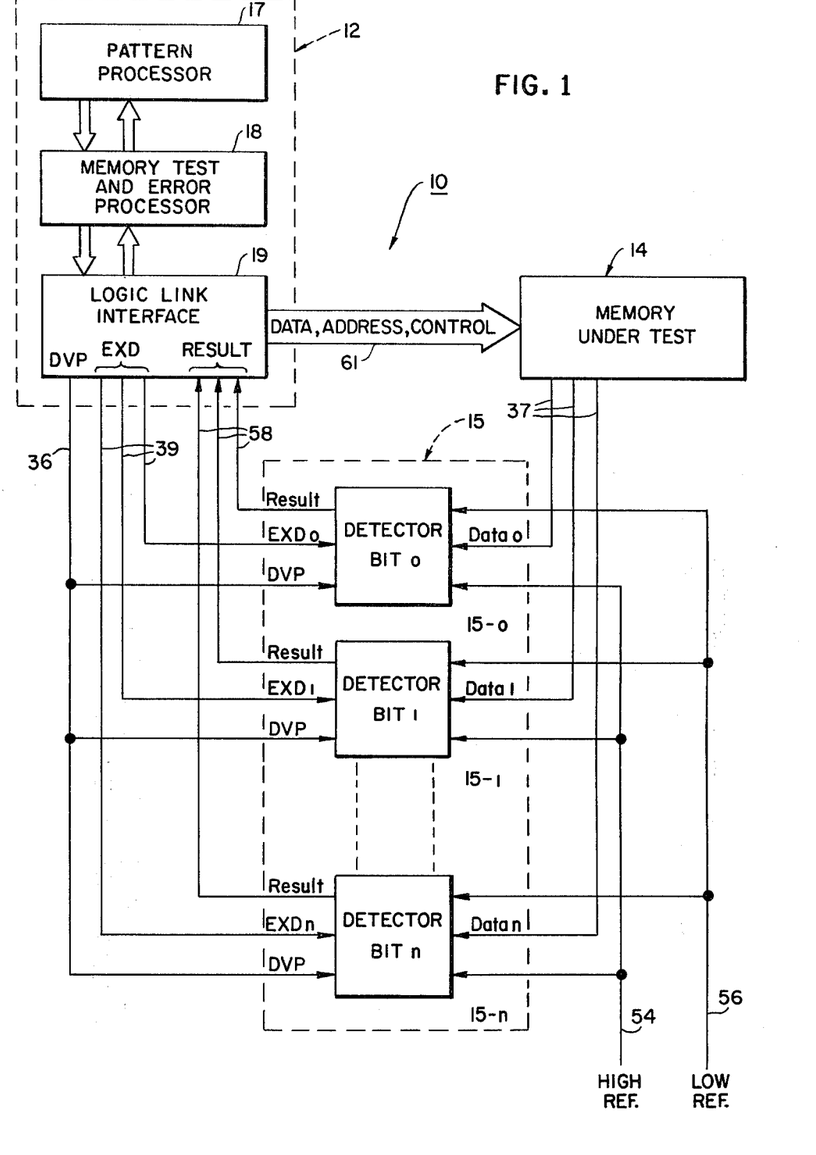
FIG. 1 is a simplified block diagram illustrating the major portions of an automated test set, together with a memory circuit to be tested, as interconnected to the test circuit embodying the principles of the present invention, which circuit is adapted to continuously monitor the validity, within prescribed voltage limits, of the output state of a memory under test during each test set-established time window interval, and provide pass/fail information to the test set.

With particular reference now to FIG. 1, there is depicted a composite test set 10 which includes a conventional automated test set, shown within the dash-lined box 12, a solid state read/write memory 14 to be tested, and a unique intercoupled composite test circuit 15 embodying the principles of the present invention.

For purposes of illustration only, one preferred type of automated test set 12 applicable for use with the test circuit 15 embodied herein is comprised of three basic operating units, namely, a Pattern Processor 17, a Memory Test and Error Processor 18 and a Logic Link Interface 19. These units are selectively interconnected bi-directionally, as indicated by the double-arrowed channels therebetween.

Described only briefly, the Pattern Processor (PP) 17 uses suitable microcode to sequentially generate the necessary address and data signals applicable for use in testing a given memory. These signals are generated under programmable software control.

The Memory Test and Error Processor (MTEP) 18 generates the necessary control and formatted data and address signals, compares the output state or result of a memory under test relative to what such an output state was intended to be as established internally, and flags the Pattern Processor 17 should any errors be detected. The Logic Link Interface (LLI) 19 functions to interconnect the test set with the memory 14 (or any other type of IC circuit to be tested), as well as the composite test circuit 15, and provides necessary access points for all input/output signals associated with the test set. Coupling of both the memory 14 to be tested and the test circuit 15 to the Logic Link Interface 19 is accomplished preferably through the use of connectorized cables.

In a typical memory testing operation without the test circuit 15 embodied herein, the output of the memory 14 would normally be applied as an input to the test set through the Logic Link Interface 19, and only momentarily sensed in a "snap-shot" manner through the internal generation of a Data Strobe Input (DSI) pulse. Such a strobe pulse would normally be program-controlled to occur some time during the Data Valid Period (DVP) established by the test set. However, in accordance with the principles of the present invention, the data strobe pulse, as shown in waveforms d and d' of FIGS. 4 and 5, respectively, is program-controlled to occur after each successive Data Valid Period (DVP) or time window, but before the end of each successive test set-initiated read cycle, for advantageous reasons described in greater detail hereinbelow.

As further details with respect to the automated test set are not necessary with respect to an understanding of the present invention, reference is simply made to the fact that one preferred type of automated test set that is particularly applicable for use with the unique test circuit 15 embodied herein is sold by Macrodata, Inc., a subsidiary of the Eaton Corp., as Model No. MD207/11. For further details as to the circuit architecture of that test set, as well as to the mode of operation and diverse types of device and circuit testing that may be carried out therewith, reference is made to the descriptive literature pertaining thereto available from Macrodata, Inc. It is understood, of course, that there are a number of similar automated test sets commercially available from other test set manufacturers that are also applicable for use with the test circuit 15 embodied herein.

With respect to the memory 14 to be tested, it may comprise any type of read/write solid state memory and, thus, may be of the RAM, ROM or E-PROM types, for example. While such memories are generally fabricated in accordance with C-mos or TTL cell structures, memories such as of the charge-coupled type may also be readily tested with both the test set 12 and the associated test circuit 15 embodied herein.

Figure 2:
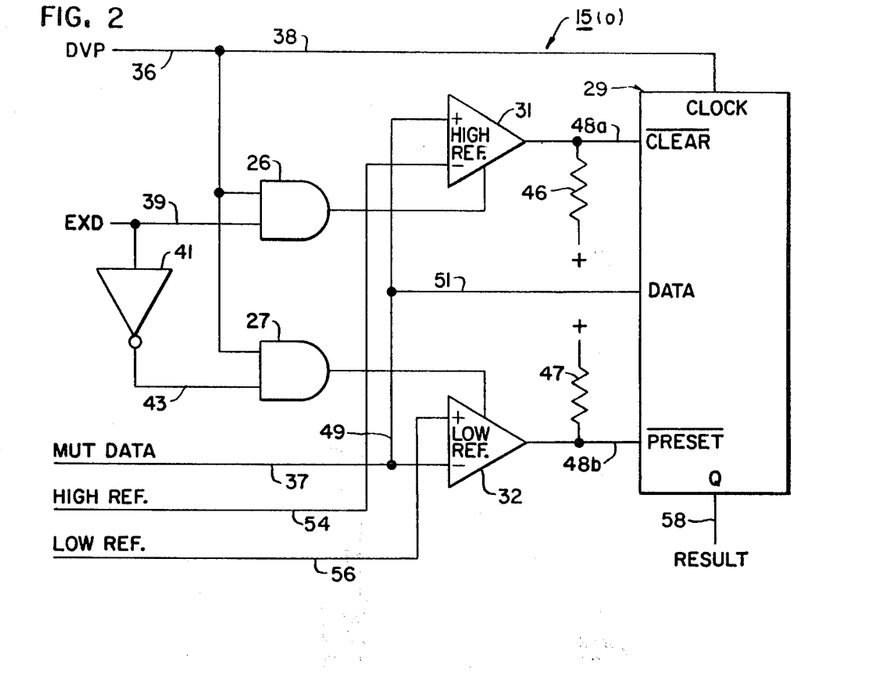
FIG. 2 is a schematic circuit diagram of one representative test circuit module as parallel-connected in the composite test circuit of FIG. 1.

Attention is now particularly directed to the test circuit 15 of primary concern herein, and, more specifically, to one module $15_o$ thereof disclosed in greater detail in schematic circuit diagram form in FIG. 2 It is understood, of course, as illustrated in FIG. 1, that there will normally be a plurality of circuit modules $15_o$-$15_n$ employed in the composite test set 15 corresponding in total to the number of output data bit lines of a given memory 14 to be tested.

As briefly described hereinabove, the circuit module $15_o$ is capable of not only ascertaining if a given memory 14 under test is initially producing a valid output (i.e., either a "one" or a "zero" at the start of a test set-initiated Data Valid Period (DVP), or time window, but to continuously monitor that output to insure that it remains valid, i.e., remains continuously above a minimum threshold voltage if it is a "one" data bit, or below a maximum threshold voltage if it is a "zero" data bit, throughout the test set-established time window. Advantageously, the test module $15_o$ performs all of these criteria checks in question at the operating speed of the memory under test, and produces a pass/fail output "Result" signal that not only is compatible with the internal dectection circuitry of the associated automated test set, but remains available for examination during the entire period of time between the end of each time window and the start of each successive memory strobed read cycle initiated by the test set.

Such a unique mode of operation is accomplished in the test circuit 15 as a result of each circuit module $15_{o-n}$ comprising a pair of AND gates 26, 27 that are respectively coupled to the control inputs of High Reference and Low Reference operational amplifiers 31, 32, with the outputs of the latter being respectively coupled to the $\overline{\text{Clear}}$ and $\overline{\text{Preset}}$ inputs of a clock-driven, resettable flip-flop 29. Considered more specifically, one input of each AND gate 26 or 27 is connected to a Data Valid Period (DVP) signal line 36, the opposite end of which is connected to an output terminal of the Logic Link Interface 19 which, as previously noted, forms part of the composite test set 12.

The duration of the DVP signal from the test set 12 defines the time window during which the test module $15_o$ is responsive to any abnormal changes in an output data bit signal applied thereto over a Memory Under Test (MUT) data line 37 from the memory 14. The DVP signal is also applied over a branch line 38 to the clock input of the flip-flop 29, thereby, controlling the cycle time thereof.

A second input of the AND gate 26 is connected to an EXD signal line 39. This line is likewise connected to an output terminal of the Logic Link Interface 19 (see FIG. 1). As indicated in the signal function table of FIG. 3, an EXD signal generated by the test set 12 conditions the module $15_o$ to expect either a "one" or a "zero" output data bit from the memory 14 under test during a given time window test period. An inverter 41 provides the complement of each successive EXD signal received on line 39, and applies it over a line 43 to the second input of the AND gate 27.

The output of the AND gate 26 is applied as an Enable signal to the control input of the High Reference operational amplifier 31. Similarly, the output of the AND gate 27 is applied as an Enable signal to the control input of the Low Reference operational amplifier 32. The outputs of both operational amplifiers are respectively biased by pull-up resistors 46 and 47, each connected to a positive voltage power supply (not shown). When the Memory Under Test is of the type operated in accordance with TTL logic, the test circuit modules $15_{o-n}$ would be adapted to sense and monitor zero and plus five volt logic levels. To that end, the pull-up resistors 46 and 47 would also be biased at plus five volts.

The significance of the pull-up resistors will be discussed in greater detail hereinbelow in connection with both the operation of the flip-flop 29, and several test circuit operating examples relating to the waveform graphs of FIGS. 4 and 5. It will thus suffice to simply state at this point that the pull-up resistors 46 and 47 prevent the outputs of the operational amplifiers 31 and 32 from floating when not enabled. As such, the pull-up resistors normally commit the output of the flip-flop to a "one" state and, more importantly, ensure that the flip-flop can neither be $\underline{\text{Cleared}}$ or $\underline{\text{Set}}$ by an extraneous pulse or induced circuit noise at any time outside each successive time window test period.

The designated positive input of the operational amplifier 31, and the negative input of the operational amplifier 32, are also both connected to the MUT DATA line 37. A branch line 51 from the MUT DATA line 37 is connected to the "D" input of the flip-flop 29. As previously noted, and indictated in the signal function table of FIG. 3, each MUT DATA signal consists of one output bit of digital information from the memory under test, as read out of the latter under the control of the test set 12.

The negative input of the operational amplifier 31 is connected to a HIGH REF. line 54, whereas the positive input of amplifier 32 is connected to a LOW REF. line 56. These high and low reference lines are connected to suitable voltage supply sources (not shown).

The particular reference voltages chosen for any given application will depend primarily on the type of memory being tested. By way of example, when the memory is of the type that operates with voltage levels of zero volts and plus five volts, the HIGH REF. voltage may be of approximately 4.8 volts, with the LOW REF. voltage being approximately 0.2 volts.

Figure 3:
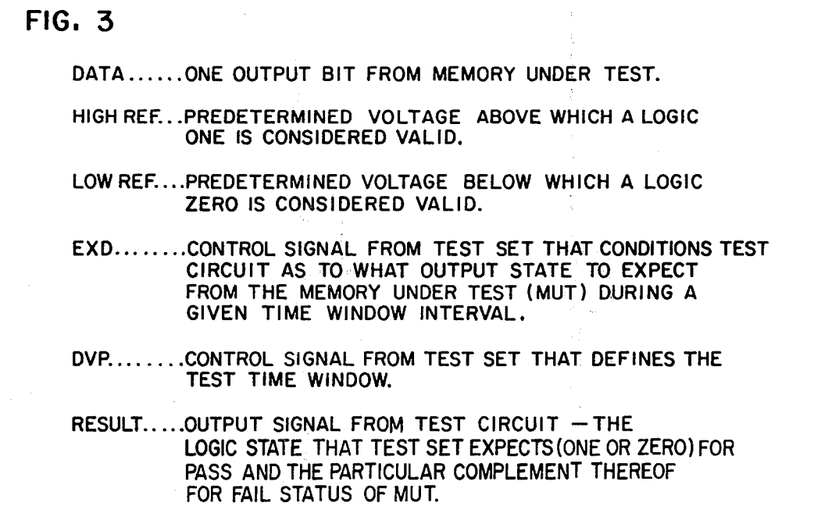
FIG. 3 is a table which defines the nature and/or functions of the various input control and data signals that are applied to, as well as the output RESULT signal resspsonsively generated by, each module of the composite test circuit embodied herein.

As indicated in the signal function table of FIG. 3, the HIGH REF. voltage constitutes a predetermined minimum voltage above which a logic "one" is considered valid, whereas a LOW REF. voltage constitutes a predetermined maximum voltage below which a logic "zero" is considered valid, in both cases throughout the entire Data Valid Period (DVP)-defined time window.

The flip-flop 29 is preferably of the so-called Data type, and operates as follows: With both the $\overline{\text{Clear}}$ and $\overline{\text{Preset}}$ inputs of the flip-flop biased at high level voltage states (e.g., at five volts versus zero volts), then the logic state of the Q output will immediately acquire the logic state of any digital Data clocked into the D input. In the illustrative circuit embodiment, this input-output state registration would coincide in time with the leading edge of a DVP signal when applied to the clock input of the flip-flop. Should the $\overline{\text{Clear}}$ input of the flip-flop be biased to a low voltage (zero) state by the operational amplifier 31 at any time while a clock pulse (DVP signal) is applied to the clock input thereof, then the flip-flop would be $\underline{\text{Cleared}}$, resulting in the state of the Q output being changed to a "zero" state, if not already at that state as a result of an initially invalid clocked in "zero" data signal. Conversely, should the $\overline{\text{Preset}}$ input of the flip-flop be biased to a low voltage (zero) state by the operational amplifier 32 at any time while a clock pulse (DVP signal) is applied to the clock input thereof, the flip-flop would then be $\underline{\text{Set}}$, resulting in the state of the Q output being changed to a "one" state, if not already at that state as a result of an invalid initially clocked in "one" data signal.

The pull-up resistors $\underline{46}$ and $\underline{47}$, as positively biased, ensure that no invalid $\overline{\text{Clear}}$ or $\overline{\text{Preset}}$ input signals, due to induced noise on lines 48a and b, for example, could change the operating state of the flip-flop outside the time window test period. This is particularly inportant during the time interval after each DVP signal applied to each test circuit module goes low, and before each Data Strobe Input (DSI) signal is generated internally by the test set 12. This latter signal, as previously noted, initiates the reading of the RESULT signal then existing at the Q output of the flip-flop.

Having described the various devices employed in each circuit module of the composite test circuit 15, and the manner in which they are selectively interconnected, accessed and biased, a general mode of operation of the circuit module $15_o$, followed by several other possible modes of circuit operation will now be described, with reference being made first to FIG. 2 and, thereafter, relative to the waveform graphs of FIGS. 4 and 5.

At the beginning of the Data Valid Period (DVP), established by the test set 12, a similarly identified signal is applied over line 36 to one input of both AND gates 26 and 27, as well as applied over branch line 38 to the Clock input of the flip-flop 29. This effects the clocking of an MUT DATA signal from the memory 14 under test, over lines 37, 49 and 51, into the "D" input of the flip-flop 29, whether the state of that data is valid or invalid. It will be recalled that a valid versus invalid data bit from the memory under test is based on what that data bit is expected to be, as evidenced by the Expected Data (EXD) signal generated by the test set 12, and applied over line 39 to the AND gate 26 directly, and indirectly through the inverter 41 and line 43, as an inverted complement, to the AND gate 27. As such, only one of the two AND gates can be enabled during any time window test period, which one depending on the state of the EXD signal that is applied as an input thereto.

Assuming, for the purpose of illustration, that the AND gate 26 has been enabled, this will, in turn, enable the High Reference operational amplifier 31. The output of the latter will then only go to a low voltage state (e.g., zero) if the MUT DATA signal applied over lines 37 and 49 to the positive input thereof is expected to be a "one", but either initially constitutes a "zero", or at some time during the DVP signal-defined time window test period falls below the HIGH REF. threshold voltage, applied over line 54 to the negative input of operational amplifier 31. When the latter produces a low voltage output, resulting in the flip-flop being Cleared, it may or may not effect a change in the then existing state of the RESULT signal at the Q output of the flip-flop.

This follows from the fact, as previously noted, that the state of the Q output of the flip-flop will always initially acquire the state of the MUT DATA signal clocked into the D input thereof. Thus, if the latter signal initially constitutes an invalid "zero", that would be the state of the RESULT signal at the slightly later time (due to inherent circuit delays) that the low voltage output of the enabled operational amplifier 31 would redundantly Clear the flip-flop, to insure that an invalid "zero" RESULT signal was produced and remain at the O output thereof until the end of the read cycle controlled by the test set 12. In the case where the MUT DATA signal, as received, was initially a valid "one", but at some time during the time window test period dropped below the HIGH REF. threshold voltage set by the operational amplifier 31, the latter would again be enabled to produce a low voltage output that would likewise Clear the flip-flop, thus changing the initial Q output thereof from a "one" or "pass" to a "zero" or "fail" RESULT signal.

The low reference operational amplifier 32 operates in the same conditional manner as described above for the operational amplifier 31, the only difference being that the former, when enabled, to produce a low voltage output, will Set (as distinguished from Clear) the flip-flop 29 so as to either directly effect, or redundantly ensure, that the Q output thereof will be a "one" or "fail" RESULT signal.

From the foregoing description of the general mode of operation of the test circuit module $15_o$, it is seen that when each successive DVP signal goes low, the time window for sensing a given data bit memory output is closed. This results in the particular AND gate then enabled being disabled which, in turn, disables the associated operational amplifier. At that time, the pull-up resistor 46 or 47 coupled to the output of the previously enabled operational amplifier maintains the input to either the Clear or Preset input of the flip-flop at a high voltage state. The flip-flop is then in condition to have a new MUT DATA signal clocked therein at the time the leading edge of the next DVP signal occurs. Until then, the Q output of the flip-flop remains unchanged.

It should also be noted that because the state of the Q output of the flip-flop initially acquires the state of the MUT DATA signal initially clocked therein, this can prove advantageous when the MUT DATA signal received is initially momentarily invalid, but becomes valid before being sensed invalid by one of the operational amplifiers, upon being enabled, and producing a low voltage output indicative of that fact. More specifically, it is conceivable that because of inherent AND gate delays, an initially invalid MUT DATA signal could become valid before one of the operational amplifiers was enabled. If that happened, the enabled operational amplifier would only sense the MUT DATA signal after it became valid and, hence, would produce only an acceptable high level output which would not change the state of the RESULT signal at the Q output of the flip-flop. This would still not affect the integrity of the test circuit 15, however, because the RESULT signal, as previously noted, immediately acquires the state of the MUT DATA signal as initially clocked therein, whether that signal was valid or invalid. Hence, the test set 12 in subsequently flagging the RESULT signal would find that it was invalid, i.e., inconsistent with the EXD signal applied to the test circuit during the preceding DVP-defined time window.

Figure 4:
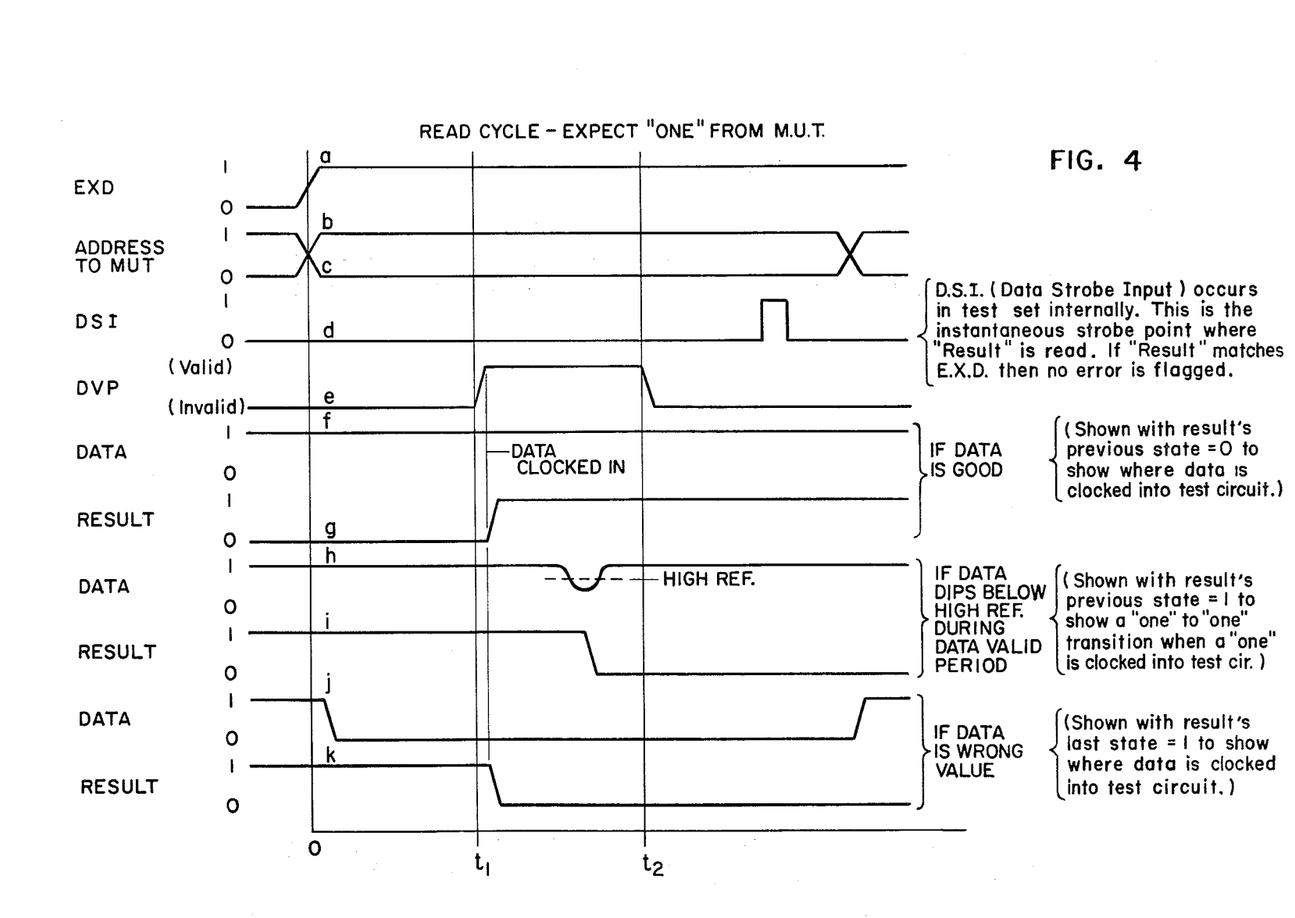
FIG. 4 is a waveform graph illustrating several voltage versus time pass/fail RESULT signals generated by the test circuit, in response respectively to a valid, and several different types of invalid, output DATA (bit) signals received from the Memory Under Test, when each of such signals were expected to constitute a valid "one" signal for purposes of illustration, as initially determined by the associated test set, for a given time window examining period established thereby.
Figure 5:
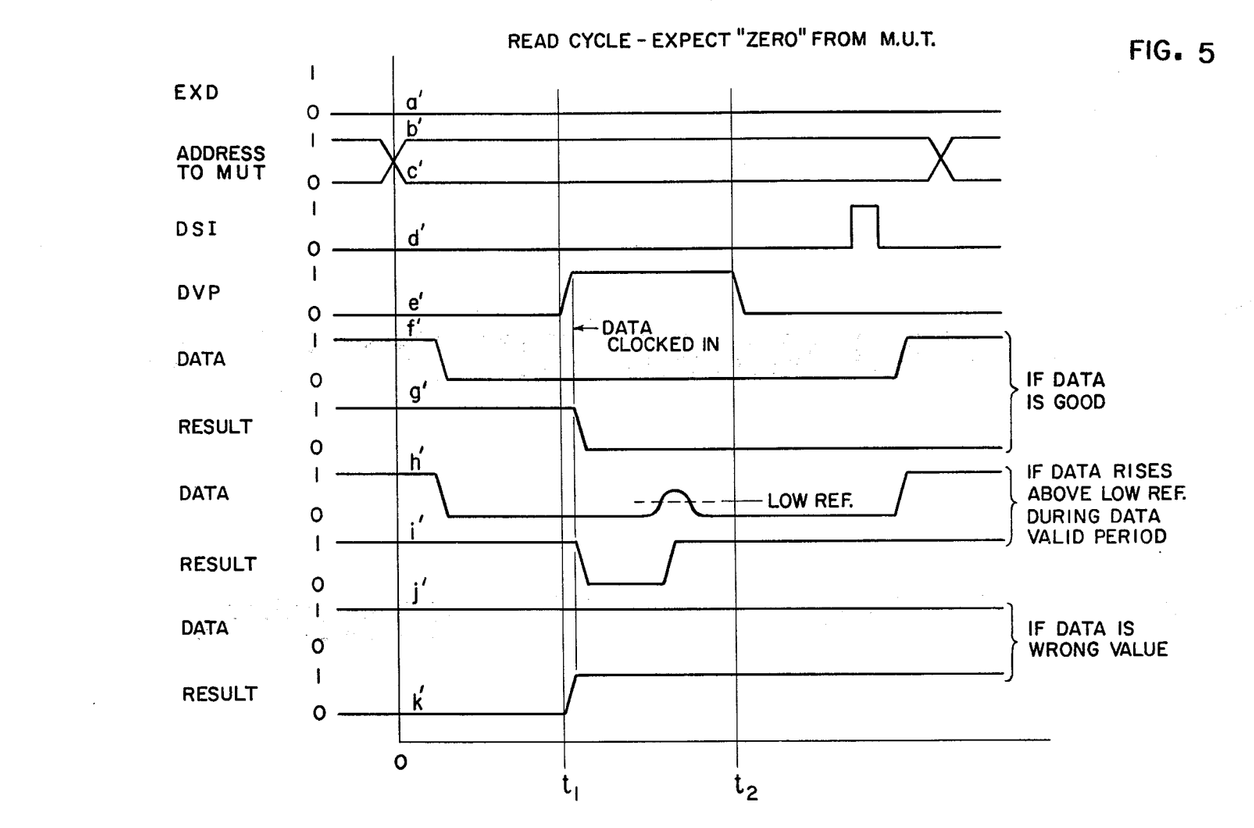
FIG. 5 is a waveform graph similar to that of FIG. 4, but distinguishing therefrom by representing several different test conditions wherein the various output DATA signals received by the test circuit from the Memory Under Test were all intended to be "zero" DATA bit signals during a given test set-established time window test period, but, in fact, are not all valid.

Reference is now made to the graphs of FIGS. 4 and 5 which illustrate various significant voltage versus time waveforms involved in the operation of the test circuit 15 under two different operation conditions, together with selective descriptive legends further defining the significance of certain ones of the waveforms. These waveforms, designated a-k in FIG. 4, are selectively generated by the test set 12 (EXD, ADDRESS, DSI and DVP), or by the memory (MUT DATA), or by the test circuit 15 embodied herein (RESULT). With respect to the MUT DATA and RESULT signals, three different sets thereof are illustrated that relate to three different Memory output conditions. In all of these cases, the test set 12 is programmed to expect that the memory 14 will generate a "one" MUST DATA bit signal, as evidenced by a high level or "one" EXD signal being applied to each circuit module AND gate 26 directly, and the complement thereof to the AND gate 27 through the inverter 41.

Considering the waveforms of FIG. 4 more specifically, it is seen that at the beginning of each read cycle, an EXD "one" signal (waveform a) is applied to each circuit module of the test circuit 15, and a plurality of ADDRESS signals (comprised of either "zeros" or "ones", and represented only generally by the two waveforms b and c, together with the other data and control signals), are applied to the memory 14 under test over the data channel 61 (seen only in FIG. 1). A Data Valid Period (DVP) signal (waveform e), also generated by the test set 12, is applied to each test circuit module $15_{o-n}$ and defines a time window test interval between the times to $t_1$ and $t_2$.

If the MUT DATA signal (waveform f) from the memory constitutes a valid "one" data bit, thus, corresponding with the EXD signal, and remains above a predetermined minimum threshold voltage level throughout the time window, as determined by the HIGH REF. threshold voltage applied to the enabled operational amplifier 31, that amplifier will then produce a high level voltage (e.g., five volts) output that will not Clear the flip-flop and, hence, will not change the then existing "one" state of the RESULT signal (waveform g). It should also be noted that the state of this latter signal likewise cannot change thereafter, as a result of the pull-up resistor 46, at least until the occurrence of the leading edge of the next succeeding DVP signal (waveform e), and only then if the state of the then received MUT DATA signal changes.

For purposes of illustration, the "one" RESULT signal is shown in waveform g as having previously been a "zero" signal so as to illustrate the point in time at which the MUT DATA signal was clocked into the D input of the flip-flop 29 and, at the same time, effected a change in the state of the Q output thereof.

Waveforms h and i illustrate an operating situation wherein the MUT DATA signal (waveform h) from the memory 14 is expected to be a "one", and initially is determined to be valid (i.e., above the predetermined minimum HIGH REF. threshold voltage of the enabled operational amplifier 31) at the beginning of a test set-established time window test interval, but which memory signal thereafter momentarily drops below the established threshold voltage. This condition results in the enabled operational amplifier 31 producing a low voltage (zero) output which Clears the flip-flop 29, and changes the initially established valid (one) RESULT signal (waveform i) to a "zero" or "fail" signal at the Q output thereof.

Waveforms j and k illustrate a test condition wherein the MUT DATA signal (waveform j) constitutes an invalid "zero" at the inception ($t_1$) of a test set-established time window test period. As previously described, this initially clocked in signal produces a corresponding "zero" or "fail" output RESULT signal (waveform k). Very shortly thereafter (due to inherent circuit delays), the enabled High Reference operational amplifier 31 produces a low level (zero) voltage output that redundantly Clears the flip-flop 29, i.e., conditions the latter such that a "zero" output RESULT signal would have then been produced if such an output state had not been initially established in response to a corresponding MUT DATA signal having been clocked into the flip-flop at the leading edge of the most recent DVP signal (waveform e). The previous test period RESULT signal is shown in waveform k as having been a "one" signal so as to further illustrate the point in time at which the next succeeding "zero" MUT DATA signal is sensed as being invalid and clocked into the D input of the flip-flop, namely, at the leading edge of the DVP signal applied thereto (waveform e).

FIG. 5 illustrates several voltage versus time waveforms, designated by the primed letters a'-k', which are similar to those of FIG. 4, but distinguish therefrom by being based on several different memory Read conditions wherein the test set 12 generates a low level or "zero" EXD signal (waveform a') and, hence, expects a valid "zero" MUT DATA output signal from the memory 14 under test. Whenever the memory does in fact continuously produce such a valid data bit output during the DVP signal-defined time window, the enabled operational amplifier 32 will produce a high level voltage (e.g., five volt) output that will not Set the flip-flop 29 and, hence, will not change the then existing "zero" state of the RESULT signal (waveform g'). The state of this latter signal likewise cannot change thereafter, as a result of the pull-up resistor 47, at least until the occurrence of the leading edge of the next succeeding DVP signal (waveform e'), and only then if the state of the then received MUT DATA signal changes.

For purposes of illustration, the "zero" RESULT signal is shown in waveform g' as having previously been a "one" signal so as to illustrate the point in time at which the MUT DATA signal was clocked into the D input of the flip-flop 29 and, at the same time, effected a change in the state of the Q output thereof.

As previously described in connection with FIG. 4, waveforms h' and i' illustrate an operating situation wherein the MUT DATA signal (waveform h') from the memory 14 is expected to be a "zero", and initially is found valid (i.e., below the predetermined maximum LOW REF. threshold voltage of the enabled operational amplifier 32) at the beginning of a test set-established time window test interval, but which memory data signal thereafter momentarily rises above the established threshold voltage. This condition results in the enabled operational amplifier 32 producing a low voltage (zero) output which Sets the flip-flop 29, and changes the initially established valid (zero) RESULT signal (waveform i') to a "one" or "fail" signal at the Q output thereof.

Waveforms j' and k' illustrate a test condition wherein the MUT DATA signal (waveform j') constitutes an invalid "one" signal at the inception ($t_1$) of a test set-established time window test period. This initially clocked in signal, as previously noted, produces a corresponding "one" or "fail" output RESULT signal (waveform k'). After only a slight circuit time delay, the enabled Low Reference operational amplifier 32 produces a low level (zero) voltage output that reduntantly Sets the flip-flop 29, i.e., conditions the latter such that a "one" output RESULT signal would have then been produced if such an output state had not been initially established in response to a corresponding MUT DATA signal having been clocked into the flip-flop at the leading edge of the most recent DVP signal (waveform e').

The waveforms d and d' in FIGS. 4 and 5 respectively depict the aforementioned DATA STROBE INPUT (DSI) signal that is generated internally by the test set 12, and which signal effects the taking of an instantaneous "snap-shot" of the output state of the memory 14 under test.

In accordance with the principles of the present invention, and through a modification of the test set software, the DSI signal, as shown, may be repositioned so as to occur at any time after the trailing edge of each successive DVP signal, but before the end of the associated read cycle. In contrast, when the test set 12 has been employed heretofore without the test circuit 15 embodied herein, the DSI signal necessarily has been programmed to occur some time during the high level state of the Data Valid Period (DVP) signal, defined by waveforms e and e' in FIGS. 4 and 5, respectively. As a result, it was not possible heretofore to continuously monitor the logic state of each memory bit output line during the entire Data Valid Period (DVP) established by the test set, and provide a pass or fail RESULT signal should the memory output become invalid at any time, even momentarily, during the defined test period.

Figure 6:
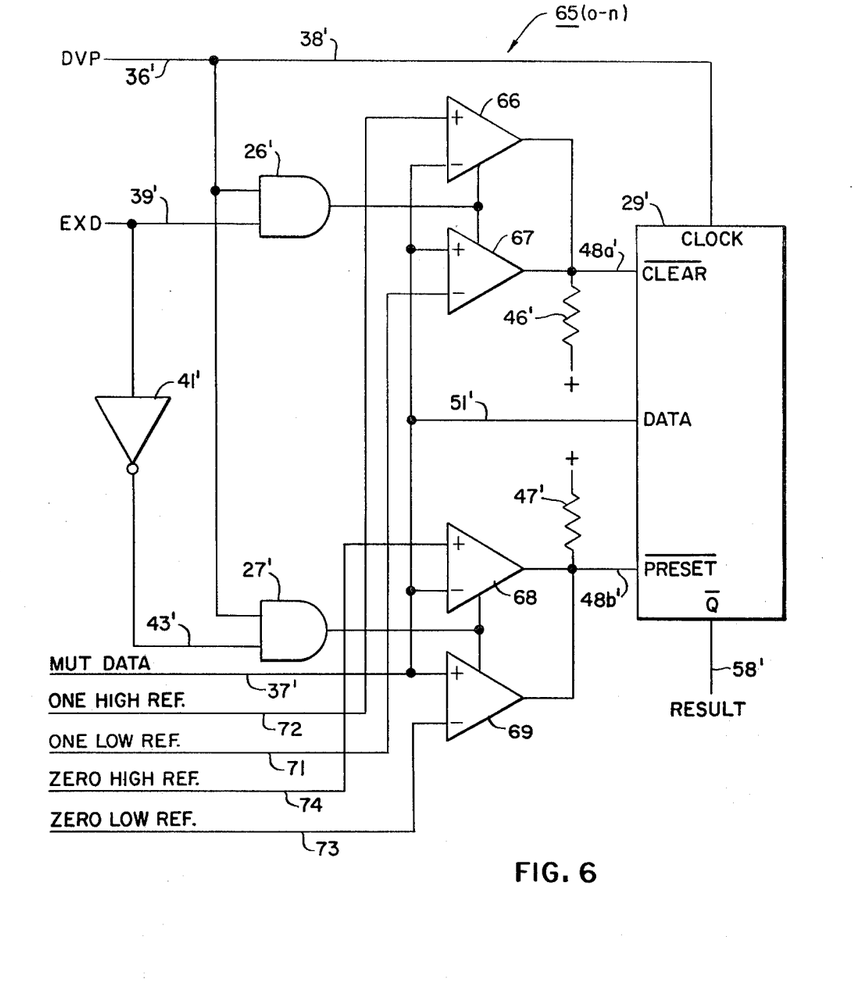
FIG. 6 is a schematic circuit diagram of a second illustrative test circuit module embodiment which distinguishes over the circuit of FIG. 2 by utilizing four rather than two operational amplifiers so as to establish both predetermined High and Low voltage limits within which each sensed and monitored DATA signal, whether it be a valid "one" or "zero", must remain during a given time window test interval.

FIG. 6 illustrates another preferred embodiment of the invention wherein a composite test circuit is comprised of a plurality of circuit modules $65_{o-n}$, arranged and interconnected to a commercial test set and memory to to be tested (neither shown) in the same manner as depicted in FIG. 1, with respect to the above-described composite test circuit 15. The test circuit modules modules $65_{o-n}$ distinguish over the circuit modules 15$_{o-n}$ by each utilizing four operational amplifiers 66–69 rather than two as in the first embodiment thereof. As thus constructed, each of the circuit modules 65$_{o-n}$ may determine the validity of either "one" or "zero" MUT DATA signals within more restrictive voltage limits than is possible with the first embodiment of the invention.

More specifically, in each test circuit module 65$_{o-n}$, each MUT DATA signal that constitutes a valid "one" must be greater than a LOW REF. voltage, applied over a line 71, and less than a HIGH REF. voltage, applied over a line 72 (neither reference voltage source being shown). Conversely, an MUT DATA signal that constitutes a valid "zero" must be greater than a LOW REF. voltage, (applied over a line 73), and less than a HIGH REF. voltage (applied over a line 74), neither of the latter reference voltage sources being shown. Such multiple threshold voltage limits are readily seen to allow valid "ones" and "zeros" to vary slightly both above and below the nominal values therefor, i.e., within prescribed voltage bands, if desired, or deemed necessary in accordance with particularly stringent memory read out test requirements.

In all other respects, each of the test circuit modules 65$_{o-n}$ are identical in structure, and function, to each of the test circuit modules 15$_{o-n}$ of FIGS. 1 and 2 and, hence, all of the other related circuit elements in the representative circuit module of FIG. 6 that correspond to those in the module 15$_o$ of FIG. 2 are identified by like, but primed, reference numerals.

While two preferred test circuits have been disclosed herein for continuously determining the proper output state of each data bit line of a memory under test throughout each successively generated time window test period, it is obvious that various modifications may be made to the present illustrative embodiments of the invention, and that a number of alternative related embodiments could be devised by one skilled in the art, without departing from the spirit and scope of the invention.

What is claimed is:

1. A test circuit for continuously sensing for the presence of valid "one" and "zero" data bit signals read out of a memory when under test throughout an established time window test period, said circuit comprising:

first means, conditionally responsive to a data bit signal, a first time window-controlling signal, and selectively to a second expected reference data bit signal and the complement thereof, when applied thereto, for comparing the logic state of each data bit signal when received from the output of a memory under test relative both to selective predetermined high and low reference voltage limits, when applied to said first means, and to a selected one of the second signal and its complement, when also applied to said first means, with the selected one of the latter two signals, during each time window test period, being predetermined to have the logic state expected of a data bit signal to be compared, and said first means, when made conditionally responsive, producing a high voltage output whenever the state of an applied data bit signal continuously remains valid throughout said time window, and for producing a low voltage output whenever such a data bit signal is sensed at any time to be invalid during a given time window, and second means, responsive to a high voltage output from said first means, and an applied first signal, for producing a "pass" output signal that corresponds in logic state to that of a continuously valid data bit signal when applied to both said first and second means during each time window, with said second means, in response to a low voltage output from said first means, and an applied first signal, producing a "fail" output signal that corresponds in logic state to that of an invalid data bit signal, even if the latter is only momentarily invalid, when applied to both said first and second means during any given time window, said "pass" and "fail" signals remaining for interrogation after the termination of said time window, and a change of any low voltage output from said first means to a high voltage output, until at least the termination of each data bit signal as applied to both said first and second means.

2. A test circuit in accordance with claim 1 wherein said first means includes a first AND gate, conditionally enabled when the first and second signals are applied thereto, and a first operational amplifier responsively coupled thereto, for sensing for the presence of an expected valid, as well as an invalid, logic "one" data bit signal when applied as a control input to said first operational amplifier, and further including a second AND gate, conditionally enabled when the first signal and the complement of the second signal are applied thereto, and a second operational amplifier responsively coupled thereto, for sensing for the presence of an expected valid, as well as an invalid, logic "zero" data bit signal when applied as a control input to said second operational amplifier.

3. A test circuit in accordance with claim 2 wherein said second means comprises a flip-flop, with the first signal when generated being applied to a clock input thereof, the output of said first operational amplifier being applied to a $\overline{\text{Clear}}$ input thereof, the output of said second operational amplifier being applied to a $\overline{\text{Preset}}$ input thereof, and said data bit signal, when generated being applied to a Data input thereof.

4. A test circuit in accordance with claim 1 wherein said circuit is of a composite type formed of a plurality of identical test circuits, each of which senses the expected logic state of a different data bit signal from a different output line of a memory under test, wherein the first and second signals when generated are correspondingly applied to each of said test circuits forming said composite circuit, and wherein the high and low reference voltage limits when established are applied as inputs to each of said first means of said test circuits.

5. A test circuit in accordance with claim 3 wherein said circuit is of a composite type formed of a plurality of identical test circuits, each of which senses for the expected logic state of a different data bit signal from a different output line of a memory when under test, wherein the first and second signals when generated are correspondingly applied to each of said test circuits forming said composite circuit, and wherein the high and low reference voltages defining limits when generated are applied as inputs to the first and second operational amplifiers, respectively, of each test circuit.

6. A test circuit in accordance with claim 1 further including an automated test set for controlling the read out of a memory while under test, and the transmission of said data bit signals therefrom to said test circuit, and wherein said test set generates said first and second signals applied to said test circuit, and flags said "pass" and "fail" output signals applied thereto from said second means after the termination of each test set-established time window test period.

7. A test circuit in accordance with claim 6 wherein said circuit is of a composite type formed of a plurality of identical test circuits, each of which senses the expected logic state of a different data bit signal received from a different output line of a memory under test, wherein the first and second signals generated by said test circuits forming said composite circuit, and wherein said composite circuit further includes high and low reference voltage sources for applying the high and low reference voltage limits as inputs to each of said first means of said test circuits.

8. A test circuit for testing the output state of a data bit line of a logic memory continuously during a predetermined time window test period, said circuit comprising:

first and second means commonly conditionally responsive to a first time window-controlling input signal, when applied thereto, with said first means being further conditionally responsive to a second expected reference data bit signal when applied thereto, and said second means being further conditionally responsive to the complement of the second signal, said first and second means when selectively enabled respectively producing first and second output signals;

third and fourth voltage comparing means, said third means being enabled by said first output signal, and producing a high level voltage output whenever a data bit signal applied as an input thereto from a memory under test remains above a predetermined high reference voltage when also applied as a compared input thereto, with said fourth means being enabled by said second output signal, and producing a high level voltage output whenever a data bit signal applied as an input thereto from a memory under test remains below a predetermined low reference voltage when also applied as a compared input thereto, and fifth means coupled to the outputs of said third and fourth means for producing a "pass" output signal having a logic state that corresponds to that of a data bit signal when applied to said fifth means and sensed by an enabled one of said third and fourth means to have remained continuously valid during a given time window test period, and for producing a "fail" output signal having a logic state that corresponds to an invalid data bit signal when applied to said fifth means should said signal have been sensed as being invalid at any time by an enabled one of said third and fourth means during the given time window test period.

9. A test circuit in accordance with claim 8 wherein said first and second means comprise AND gates, and wherein said third and fourth means respectively enabled thereby comprise operational amplifiers.

10. A test circuit in accordance with claim 9 wherein said fifth means comprises a flip-flop, with the output of said third means-operational amplifier being applied to a $\overline{\text{Clear}}$ input thereof, the output of said fourth means-operational amplifier being applied to a $\overline{\text{Preset}}$ input thereof, the first signal when generated being applied to a clock input thereof, and said data bit signal when generated being applied to a Data input thereof.

11. A test circuit in accordance with claim 8 wherein said test circuit is of a composite type comprised of a plurality of identical test circuits, with each circuit being associated with a different data bit line of a memory when under test, wherein corresponding ones of said first and second signals when generated are applied to each of said test circuits forming said composite circuit, wherein each of said third means has a high reference voltage commonly applied as one input thereto, with the associated data bit signal when generated being applied as a second input thereto, and wherein each of said fourth means has a low reference voltage applied as one input thereto, with the associated data bit signal when generated being applied as a second input thereto.

12. A test circuit in accordance with claim 10 wherein said test circuit is of a composite type comprised of a plurality of identical test circuits, with each circuit being associated with a different data bit line of a memory when under test, wherein corresponding ones of said first and second signals when generated are applied to each of said test circuits forming said composite circuit, wherein each of said third means-operational amplifiers is adapted to receive a common high reference voltage as one input thereto, with the associated data bit signal when generated being applied as a second input thereto, and wherein each of said fourth means-operational amplifiers is adapted to receive a common low reference voltage as one input thereto, with the associated data bit signal when generated being applied as a second input thereto.

13. A test circuit in accordance with claim 8 further including an automated test set for controlling the read out of a memory while under test, and the transmission of said data bit signals therefrom to said test circuit, and wherein said test set generates said first and second signals applied to said test circuit, and flags said output signals applied thereto from said second means after the termination of each test set-established time window test period.

14. A test circuit in accordance with claim 12 further including an automated test set for controlling the read out of a memory while under test, and the transmission of said data bit signals from each output line thereof to a different one of said test circuits, and wherein said test set generates said first and second signals applied to each of said test circuits, and flags said "pass" and "fail" output signals applied thereto from said flip-flop after the termination of each test set established time window test period.

15. A test circuit in accordance with claim 10 further including a separate pull-up resistor connected to the output of each of said operational amplifiers, said resistor being of a value when biased with a predetermined positive voltage to establish a high level voltage which simulates the output of the associated operational amplifier when both disabled and when enabled in response to a valid data bit signal being applied as an input thereto during a time window test period.

16. A test circuit in accordance with claim 12 further including a separate pull-up resistor connected to the output of each of said operational amplifiers, said resistor being of a value when biased with a predetermined positive voltage to establish a high level voltage which simulates the output of the associated operational amplifier when both disabled and when enabled in response to a valid data bit signal being applied as an input thereto during a time window test period.

17. A test circuit in accordance with claim 10 further including a third operational amplifier, the output of which is coupled to said third means-operational amplifier, said third operational amplifier being enabled by said first means-AND gate, and being adapted to compare a data bit signal with a second predetermined low reference voltage when both are applied as inputs thereto, and said test circuit further including a fourth operational amplifier, the output of which is coupled to said fourth means-operational amplifier, said fourth operational amplifier being enabled by said second means-AND gate, and being adapted to compare a data bit signal with a second predetermined high reference voltage when both are applied as inputs thereto.

18. A test circuit in accordance with claim 12 wherein each of said test circuits further includes a third operational amplifier, the output of which is coupled to said third means-operational amplifier, said third operational amplifier being enabled by said first means-AND gate, and being adapted to compare a data bit signal with a second predetermined low reference voltage when both are applied as inputs thereto, and wherein each of said test circuits further includes a fourth operational amplifier, the output of which is coupled to said fourth means-operational amplifier, said fourth operational amplifier being enabled by said second means-AND gate, and being adapted to compare a data bit signal with a second predetermined high reference voltage when both are applied as inputs thereto.

19. A test circuit for testing the logic state of a data signal, when applied thereto, continuously during a predetermined time window test period, said circuit comprising:

first means, conditionally responsive to a time window-controlling input signal, and to a second expected reference data signal, when applied thereto, for producing selectively first and second output signals;

second means responsive to said first and second output signals, said first output signal resulting in one output of said second means producing a first high level output voltage whenever a data signal applied as an input thereto continuously corresponds with one particular logic state of an expected reference data signal when applied to said first means during any given time window test period, with said second output signal resulting in another output of said second means producing a second high level output voltage whenever a data signal applied as an input thereto continuously corresponds with another particular logic state of an expected reference data signal when applied to said first means during any given time window test period, and third means coupled to the output of said second means, and being conditionally responsive to a time window-controlling input signal, for selectively generating "pass" and "fail" output signals, a "pass" signal being generated in response to, and being indicative of, a continuous correspondence in logic state between an expected reference data signal and an input data signal to be tested, when applied to said first and third means, respectively, during a given time window test period, with a "fail" signal being generated in response to, and being indicative of, a lack of such continuous time-window logic state signal correspondence.

20. A test circuit in accordance with claim 19 wherein said first means comprises first and second AND gates, and wherein said second means comprises first and second operational amplifiers which are respectively enabled by said first and second AND gates when selectively enabled.

21. A test circuit in accordance with claim 20 wherein said third means comprises a flip-flop, with the output of said first operational amplifier of said second means being applied to a $\overline{\text{Clear}}$ input thereof, the output of said second operational amplifier of said second means being applied to the $\overline{\text{Preset}}$ input thereof, the first time-window controlling signal when generated being applied to a clock input thereof, and said input data signal when generated being applied to a Data input thereof.

* * * * *